(12) United States Patent
Kuo et al.

(10) Patent No.: US 12,363,996 B2
(45) Date of Patent: Jul. 15, 2025

(54) SEMICONDUCTOR STRUCTURE AND METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Liang-Tai Kuo, Hsinchu County (TW); Hsin-Li Cheng, Hsinchu County (TW); Yingkit Felix Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 423 days.

(21) Appl. No.: 17/697,651

(22) Filed: Mar. 17, 2022

(65) Prior Publication Data

US 2023/0299073 A1     Sep. 21, 2023

(51) Int. Cl.
| | | |
|---|---|---|
| H01L 21/00 | (2006.01) | |
| H10D 1/47 | (2025.01) | |
| H10D 30/60 | (2025.01) | |
| H10D 62/10 | (2025.01) | |
| H10D 84/01 | (2025.01) | |
| H10D 84/03 | (2025.01) | |
| H10D 84/80 | (2025.01) | |

(52) U.S. Cl.
CPC ............ *H10D 84/811* (2025.01); *H10D 1/47* (2025.01); *H10D 30/601* (2025.01); *H10D 62/126* (2025.01); *H10D 84/013* (2025.01); *H10D 84/038* (2025.01)

(58) Field of Classification Search
CPC .. H10D 84/811; H10D 30/601; H10D 84/013; H10D 84/62126; H10D 1/47; H10D 84/038; H01L 27/0629; H01L 21/823418; H01L 28/20; H01L 29/0692; H01L 29/7833
See application file for complete search history.

(56) References Cited

U.S. PATENT DOCUMENTS

| | | | |
|---|---|---|---|
| 2008/0111193 A1* | 5/2008 | Chen | H01L 27/0629 257/E27.047 |
| 2022/0271116 A1* | 8/2022 | Adusumilli | H01L 27/1203 |

* cited by examiner

*Primary Examiner* — Richard A Booth
(74) *Attorney, Agent, or Firm* — WPAT LAW; Anthony King

(57) ABSTRACT

A semiconductor structure includes a semiconductor substrate, a serpentine-shaped resistor, and a MOS transistor. The semiconductor substrate includes an isolation structure and an active region. The serpentine-shaped resistor is over the isolation structure. The serpentine-shaped resistor extends in a length direction and has a width that is equal to or greater than about 3.6 μm in a width direction. The MOS transistor is over the active region of the semiconductor substrate.

20 Claims, 16 Drawing Sheets

SEMICONDUCTOR STRUCTURE AND METHOD OF MANUFACTURING SEMICONDUCTOR STRUCTURE

BACKGROUND

Polysilicon resistors have been frequently used in various integrated circuit (IC) designs. However, various integration issues exist when combining polysilicon resistors and metal-oxide-semiconductor (MOS) transistors onto a single IC chip. Therefore, an improved polysilicon resistor structure and a method of making the same are needed to address the above issues.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
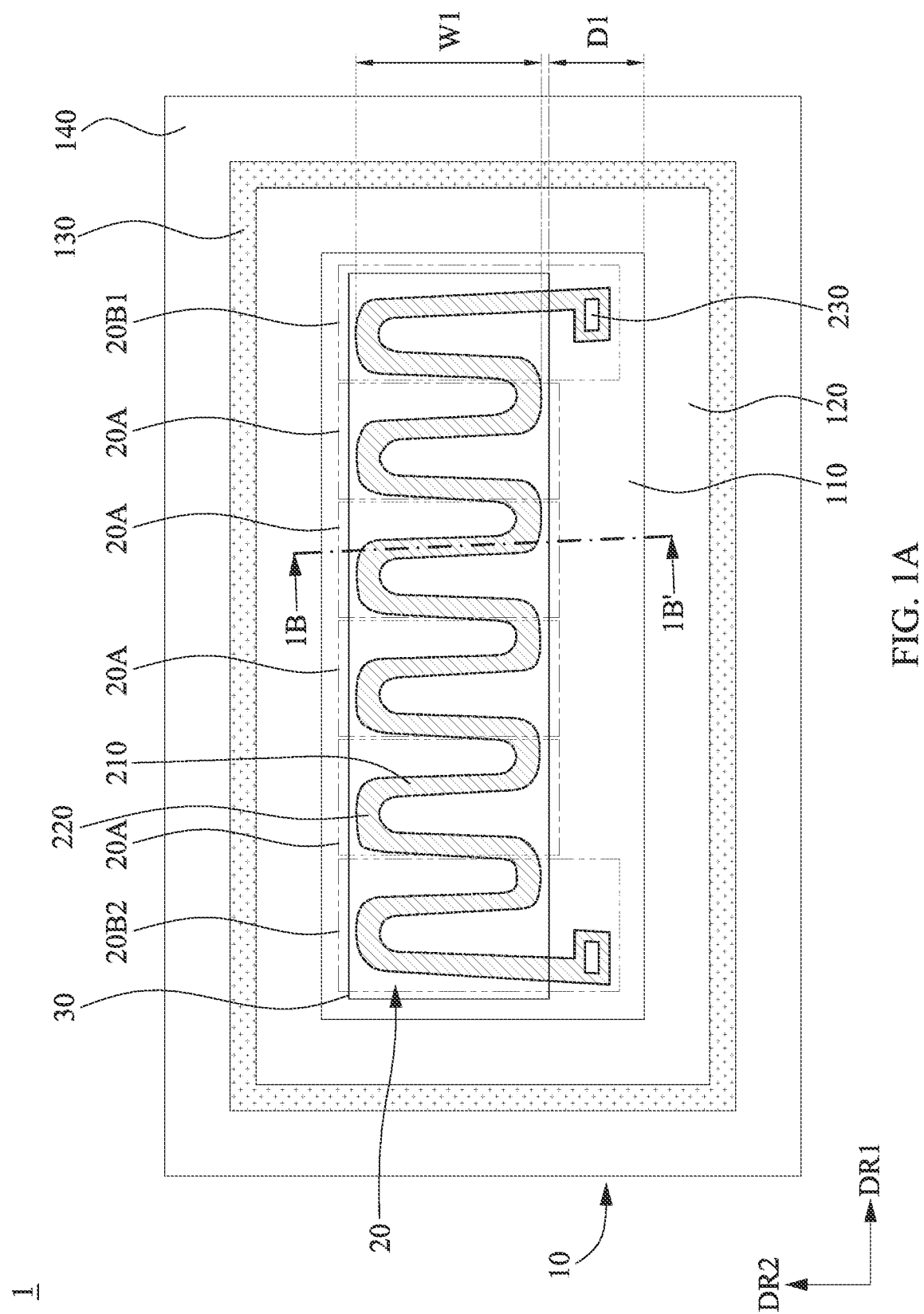
FIG. 1A is a top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss semiconductor structures including a serpentine-shaped resistor which can both provide a relatively high resistance compared to strip-shaped resistors and effectively reduce the area of the resistor. In addition, the serpentine-shaped resistor has a width of equal to or greater than about 3.6 μm, the rounding effect possibly caused by the serpentine-shaped design can be mitigated or prevented, and thus the serpentine-shaped resistor can be provided with a relatively high and stable resistance value.

FIG. 1A is a top view of a semiconductor structure 1 in accordance with some embodiments of the present disclosure.

Referring to FIG. 1, in some embodiments, the semiconductor structure 1 includes a semiconductor substrate 10, a serpentine-shaped resistor 20, and a resist protective oxide (RPO) layer 30.

The semiconductor substrate 10 may include silicon, germanium, silicon germanium, or other proper semiconductor materials. The semiconductor substrate 10 may be a bulk substrate or constructed as a semiconductor on an insulator (SOI) substrate. In some embodiments, the semiconductor substrate 10 includes one or more isolation structures 110 and one or more active regions 120 (also referred to as "device regions"). The active region 120 may be defined by the isolation structure 110. In some embodiments, the semiconductor substrate 10 further includes various doped regions (e.g., doped regions 130 and 140) depending on design requirements as known in the art. In some embodiments, the doped region 130 includes a guard ring surrounding the active region 120. In some embodiments, the doped region 140 includes a well structure surrounding the doped region 130 (or the guard ring).

The isolation structure 110 may include a shallow trench isolation (STI) features. In some embodiments, the isolation structure 110 includes one or more insulator materials such as silicon oxide, silicon nitride, or silicon oxynitride. The active region 120 may be or include a doped region. In some embodiments, the active region 120 includes an n-type dopant, the doped region 130 includes an n-type guard ring, and the doped region 140 includes an n-well structure. In some embodiments, the active region 120 includes a p-type dopant, the doped region 130 includes a p-type guard ring, and the doped region 140 includes a p-well structure or a p-type substrate. The doped regions may be doped with p-type dopants, such as boron or $BF_2$; n-type dopants, such as phosphorus or arsenic; or a combination thereof.

The serpentine-shaped resistor 20 may be disposed over the isolation structure 110 of the semiconductor substrate 10. In some embodiments, the serpentine-shaped resistor 20 extends in a direction DR1 (also referred to as "a length direction" or "a first direction") and has a width W1 in a direction DR2 (also referred to as "a width direction" or "a second direction"). The direction DR1 may be substantially perpendicular to the direction DR2. In some embodiments, the width W1 of the serpentine-shaped resistor 20 is equal to or greater than about 3.6 µm. In some embodiments, the width W1 of the serpentine-shaped resistor 20 is equal to or greater than about 4 µm. In some embodiments, the width W1 of the serpentine-shaped resistor 20 is equal to or greater than about 6 µm. In some embodiments, the width W1 of the serpentine-shaped resistor 20 is equal to or greater than about 30 µm. In some embodiments, the width W1 of the serpentine-shaped resistor 20 is from about 3.6 µm to about 60 µm. In some embodiments, the width W1 of the serpentine-shaped resistor 20 is from about 4 µm to about 60 µm. In some embodiments, the width W1 of the serpentine-shaped resistor 20 is from about 6 µm to about 60 µm. In some embodiments, the width W1 of the serpentine-shaped resistor 20 is from about 30 µm to about 60 µm.

In some embodiments, the serpentine-shaped resistor 20 includes a plurality of repeating segments 20A (also referred to as "repeating resistor segments") connected to each other in the direction DR1 (or the length direction). In some embodiments, the repeating segments 20A may be or include zigzag-shaped segments. In some embodiments, the width W1 of the serpentine-shaped resistor 20 is defined by a maximum width of the repeating segments 20A (or the zigzag-shaped segments) in the direction DR2. For example, the width W1 may be defined by a maximum distance between opposite outer edges of one of the zigzag-shaped segments in the direction DR2.

In some embodiments, the serpentine-shaped resistor 20 includes a plurality of line portions 210 and a plurality of curved portions 220, and the line portions 210 are connected to each other through the curved portions 220. In some embodiments, the curved portion 220 is U-shaped, semi-ring shaped, or half-ring shaped. In some embodiments, the line portions 210 are substantially in parallel to each other. In some embodiments, the line portions 210 are substantially in parallel to the direction DR2 (or the width direction). In some embodiments, the line portions 210 are tilted away from a virtual line extending in the direction DR2 by an angle of greater than 0° and less than about 10°. In some embodiments, the line portions 210 are tilted away from a virtual line extending in the direction DR2 by an angle of less than about 80, about 50, about 4°, about 3°, about 2°, or about 1°. In some embodiments, at least two of the line portions 210 may tilt away from a virtual line extending in the direction DR2 and toward different directions.

In some embodiments, each of the repeating segments 20A includes two line portions 210 and two curved portions 220. In some embodiments, one curved portion 220 (or the first curved portion) connects the two line portions 210 (or the first line portion and the second line portion) of the repeating segment 20A, and the other curved portion 220 (or the second curved portion) connects a line portion 210 (or the second line portion) of the repeating segment 20A to a line portion 210 of an adjacent repeating segment 20A. In some embodiments, two lines portion 210 of the same repeating segment 20A tilt away from a virtual line extending in the direction DR2 and toward different directions. In some embodiments, the width W1 of the serpentine-shaped resistor 20 is defined by a maximum distance between the two curved portions 220 of a single repeating segment 20A in the direction DR2 (or the width direction). In some embodiments, the width W1 of the serpentine-shaped resistor 20 is defined by a maximum distance between outer edges of the two curved portions 220 of a single repeating segment 20A in the width direction.

In some embodiments, the serpentine-shaped resistor 20 further includes terminal segments 20B1 and 20B2. In some embodiments, the terminal segment 20B1 is connected to the repeating segment 20A. In some embodiments, the terminal segment 20B2 is connected to the repeating segment 20A. In some embodiments, each of the terminal segments 20B1 and 20B2 is connected to one of the repeating segment 20A. In some embodiments, the terminal segment 20B1 includes two line portions 210, a curved portion 220 connecting the two line portions 210, and a contact portion 230 connected to one line portion 210 (or the first line portion) of the terminal segment 20B1. In some embodiments, the other line portion 210 (or the second line portion) of the terminal segment 20B1 connects the curved portion 220 of the terminal segment 20B1 to an adjacent repeating segment 20A. In some embodiments, the terminal segment 20B2 includes two line portions 210, two curved portions 220 respectively connecting to the two line portions 210, and a contact portion 230 connected to one line portion 210 (or the first line portion) of the terminal segment 20B2. In some embodiments, the other line portion 210 (or the second line portion) of the terminal segment 20B2 connects to one curved portion 220 of the terminal segment 20B2 which connects to an adjacent repeating segment 20A. In some embodiments, the contact portions 230 of the terminal segments 20B1 and 20B2 are configured to provide external connection. In some embodiments, one of the contact portions 230 may electrically connect to a source region, and the other one of the contact portions 230 may electrically connect to a drain region.

In some embodiments, the terminal segments 20B1 and 20B2 are respectively connected to opposite terminal ends of the connected repeating segments 20A. In some embodiments, the number of the repeating segments 20A of the serpentine-shaped resistor 20 may be equal to or greater than 2. In some embodiments, the number of the repeating segments 20A of the serpentine-shaped resistor 20 may be equal to or greater than 5. In some embodiments, the number of the repeating segments 20A of the serpentine-shaped resistor 20 may be from 2 to 100. In some embodiments, the number of the repeating segments 20A in the serpentine-shaped resistor 20 may be from 2 to 50. In some embodiments, the number of the repeating segments 20A in the serpentine-shaped resistor 20 may be from 2 to 10. However, the number of the repeating segments 20A of the serpentine-shaped resistor 20 may vary according to actual applications and is not limited thereto.

In some embodiments, the serpentine-shaped resistor 20 includes a silicon layer over the isolation structure 110 of the semiconductor substrate 10. The silicon layer may be a patterned silicon layer having the serpentine shape. In some embodiments, the silicon layer includes polysilicon, amorphous silicon, silicon/germanium alloy, or a combination thereof. In some embodiments, the serpentine-shaped resistor 20 is free of a silicide material. In some embodiments, the serpentine-shaped resistor 20 further includes a p-type doping material in the silicon layer. The doping dose may be tuned according to the designed resistance of the serpentine-shaped resistor 20 such that the final resistance of the serpentine-shaped resistor 20 is within the designed region. In some embodiments, the doping dose may be less than about $1 \times 10^{14}$ cm$^2$. In some embodiments, the resistance of the serpentine-shaped resistor 20 is higher than about 1 Gohm.

In some embodiments, the RPO layer 30 is over the isolation structure 110 of the semiconductor substrate 10 and covers the serpentine-shaped resistor 20. In some embodiments, the contact portions 230 of the terminal segments 20B1 and 20B2 are exposed by the RPO layer 30. In some embodiments, a distance D1 between an edge of the RPO layer 30 and an edge of the isolation structure 110 is equal to or greater than about 0.6 μm.

Figure 1B:
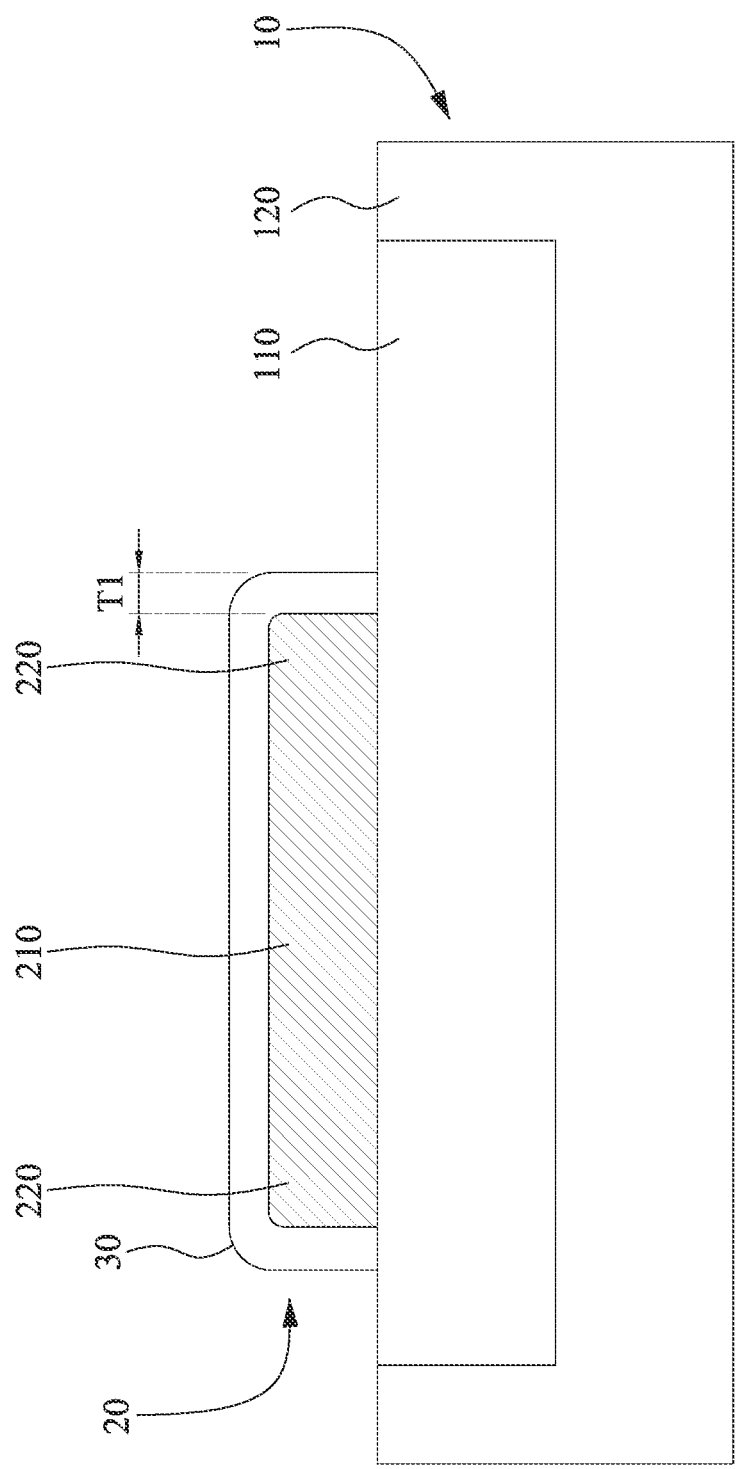
FIG. 1B is a cross-sectional view of a semiconductor structure in accordance with some embodiments of the present disclosure.

FIG. 1B is a cross-sectional view of a semiconductor structure 1 in accordance with some embodiments of the present disclosure. In some embodiments, FIG. 1B illustrates a cross-sectional view of the semiconductor structure 1 along the cross-sectional line 1B-1B' in FIG. 1A. In some embodiments, the cross-sectional line 1B-1B' and a virtual line extending in the direction D2 may formed an angle greater than 0°.

In some embodiments, the RPO layer 30 covers the line portion 210 and the curved portions 220 of the serpentine-shaped resistor 20. In some embodiments, the RPO layer 30 has a thickness T1 that is equal to or greater than about 0.3 μm.

According to some embodiments of the present disclosure, the serpentine-shaped resistor 20 can provide a relatively high resistance compared to strip-shaped resistors, while the design of the serpentine shape can effectively reduce the area of the resistor. Therefore, the serpentine-shaped resistor 20 can be provided with advantages of high resistance and low area cost.

In addition, in some cases where the serpentine-shaped resistor 20 may have a relatively small width W1 (e.g., less than about 3.6 μm), the sheet resistance of the serpentine-shaped resistor 20 may drop dramatically (e.g., less than about 800 ohm/sq) due to the rounding effect caused by the curved portions of the serpentine-shaped resistor 20. In contrast, according to some embodiments of the present disclosure, the width W1 of the serpentine-shaped resistor 20 is equal to or greater than about 3.6 μm, and thus the rounding effect can be mitigated or prevented. Therefore, the serpentine-shaped resistor 20 can be provided with a relatively high and stable resistance value.

Figure 2:
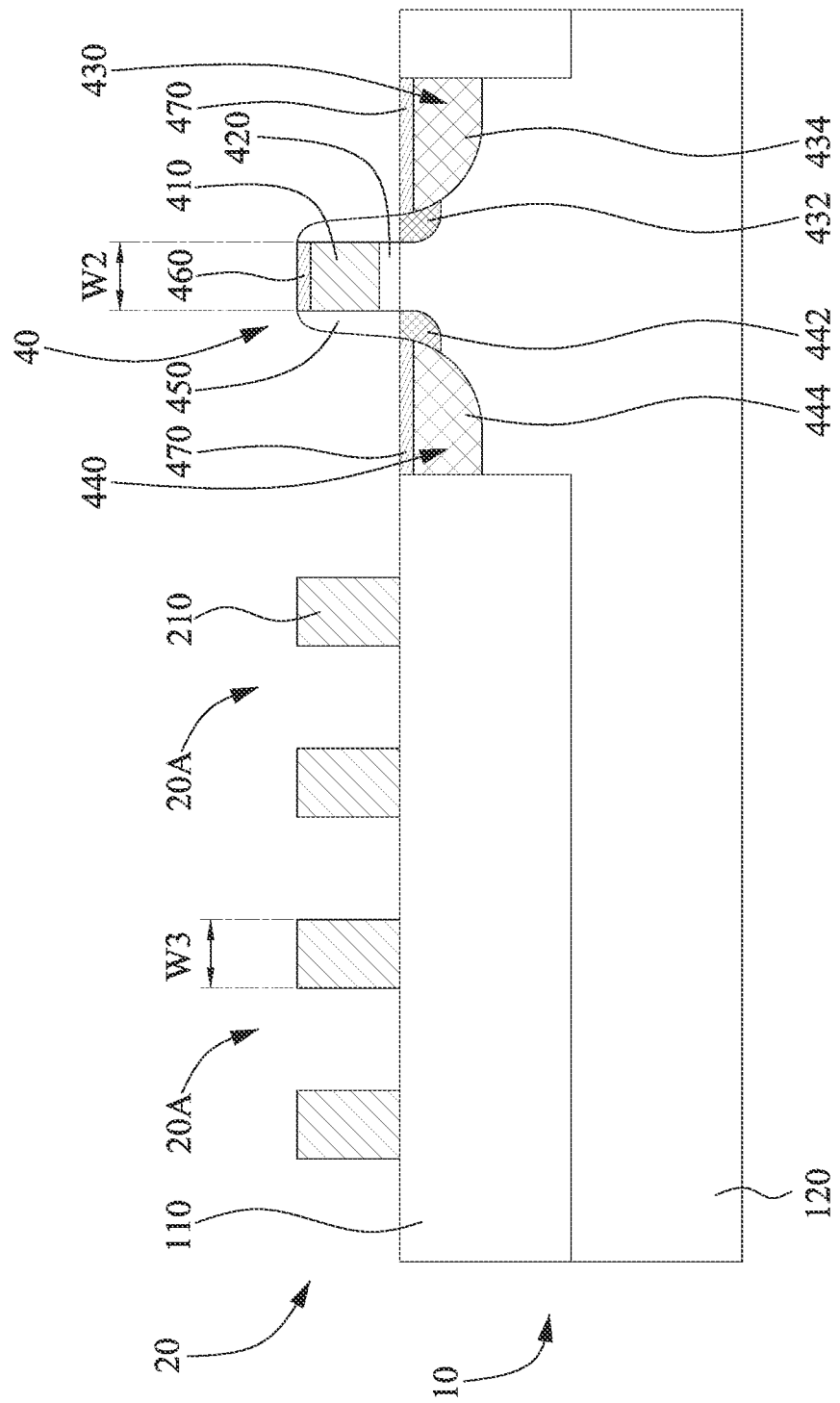
FIG. 2 is a cross-sectional view of a semiconductor structure in accordance with some embodiments of the present disclosure.

FIG. 2 is a cross-sectional view of a semiconductor structure 2 in accordance with some embodiments of the present disclosure. In some embodiments, the semiconductor structure 2 is similar to the semiconductor structure 1 in FIG. 1A and/or FIG. 1B, with differences therebetween as follows. Descriptions of similar components are omitted.

Referring to FIG. 2, in some embodiments, the semiconductor structure 2 further includes a MOS transistor 40. In some embodiments, the MOS transistor 40 is disposed over the active region 120 of the semiconductor substrate 10. In some embodiments, the MOS transistor 40 includes a gate layer 410, a dielectric layer 420 (also referred to as "a gate dielectric"), source and drain (S/D) regions 430 and 440, spacers 450, and silicide layers 460 and 470 (also referred to as "silicide contacts").

The gate layer 410 may be disposed on the dielectric layer 420. In some embodiments, the gate layer 410 is free of a p-type doping material. The dielectric layer 420 may be between the gate layer 410 and the active region 120 of the semiconductor substrate 10. The dielectric layer 420 may be or include a thermally grown oxide. The dielectric layer 420 may be or include silicon dioxide, silicon oxynitride, or a material having a dielectric constant greater than about 4. The S/D region 430 may include a lightly doped drain (LDD) region 432 and a heavily doped S/D region 434. The S/D region 440 may include an LDD region 442 and a heavily doped S/D region 444. The spacers 450 may be on lateral sides of the gate layer 410. The spacers 450 may be or include silicon dioxide, silicon oxynitride, or a combination thereof. The silicide layer 460 may be on the gate layer 410. The silicide layers 470 may be on the S/D regions 430 and 440. The silicide layers 460 and 470 may be or include nickel silicide, cobalt/nickel silicide, tungsten silicide, platinum silicide, zirconium silicide, titanium silicide, or a combination thereof.

In some embodiments, the serpentine-shaped resistor 20 is disposed on the isolation structure 110 of the semiconductor substrate 10. In some embodiments, the serpentine-shaped resistor 20 includes a plurality of repeating segments 20A each including two line portions 210 and two curved portions (not shown). In some embodiments, a line width W2 of the gate layer 410 of the MOS transistor 40 is substantially the same as a line width W3 of the line portions 210 of the serpentine-shaped resistor 20. In some embodiments, the line width W2 of the gate layer 410 is equal to or greater than about 1 μm. In some embodiments, the line width W3 of the line portions 210 of the serpentine-shaped resistor 20 is equal to or greater than about 1 μm.

Figure 3:
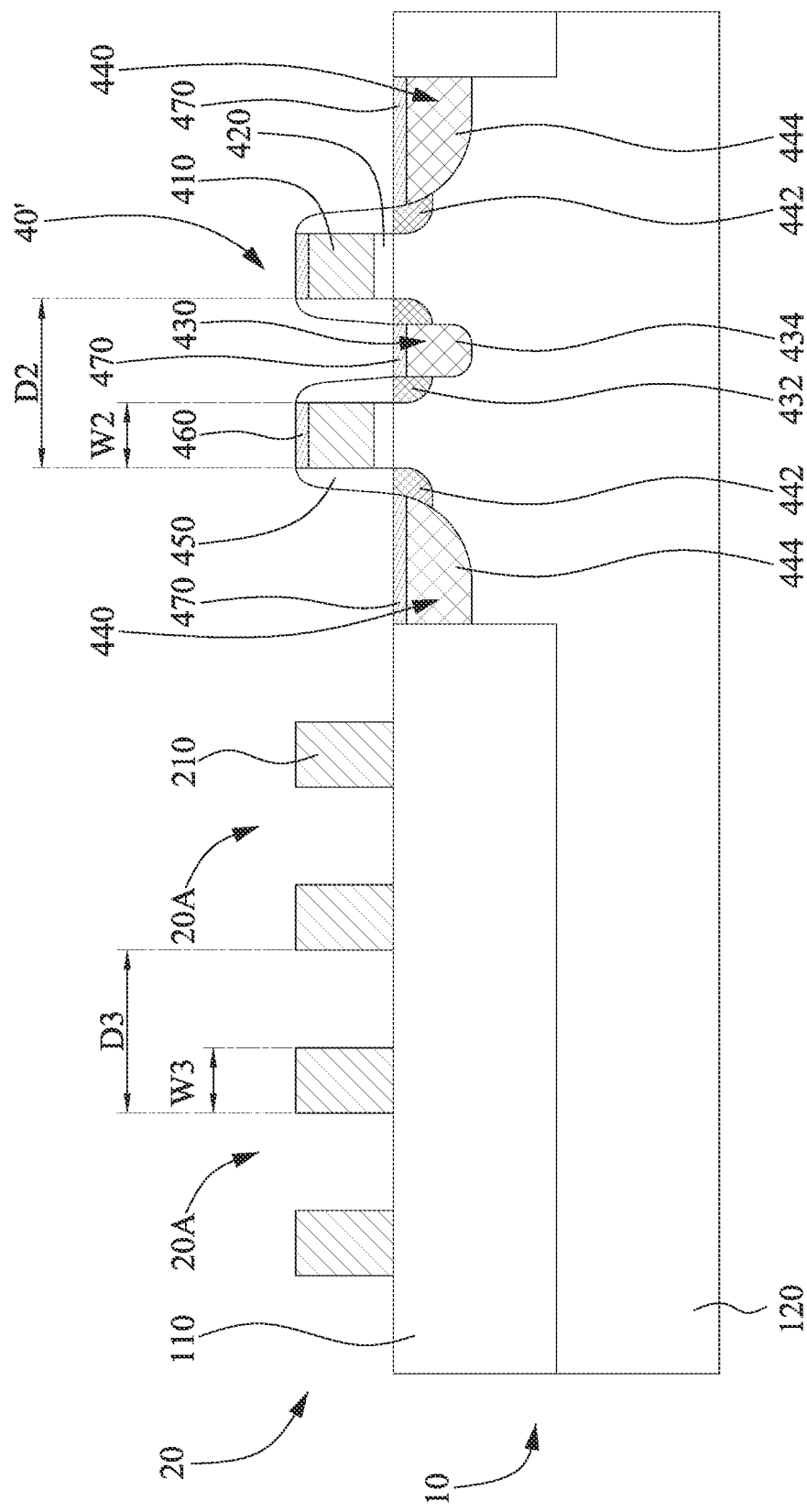
FIG. 3 is a cross-sectional view of a semiconductor structure in accordance with some embodiments of the present disclosure.

FIG. 3 is a cross-sectional view of a semiconductor structure 3 in accordance with some embodiments of the present disclosure. In some embodiments, the semiconductor structure 3 is similar to the semiconductor structure 2 in FIG. 2, with differences therebetween as follows. Descriptions of similar components are omitted.

Referring to FIG. 3, in some embodiments, the MOS transistor 40' of the semiconductor structure 3 includes a plurality of gate layers 410.

In some embodiments, the MOS transistor 40' is disposed over the active region 120 of the semiconductor substrate 10. In some embodiments, the MOS transistor 40' includes a plurality of gate layers 410, a plurality of dielectric layers 420 (also referred to as "gate dielectrics"), source and drain (S/D) regions 430 and 440, spacers 450, and silicide layers 460 and 470 (also referred to as "silicide contacts"). The gate layers 410 may be disposed on the dielectric layers 420. In some embodiments, the gate layers 410 are free of a p-type doping material. The dielectric layers 420 may be between the gate layers 410 and the active region 120 of the semiconductor substrate 10. The dielectric layers 420 may be or include a thermally grown oxide. The S/D region 430 may include an LDD region 432 and a heavily doped S/D region 434. Each of the S/D regions 440 may include an LDD region 442 and a heavily doped S/D region 444. The spacers 450 may be on lateral sides of the gate layers 410. The silicide layers 460 may be on the gate layers 410. The silicide layers 470 may be on the S/D regions 430 and 440.

In some embodiments, a pitch D2 between the gate layers 410 of the MOS transistor 40' is substantially the same as a pitch D3 between the line portions 210 of the serpentine-shaped resistor 20. In some embodiments, the pitch D2 between the gate layers 410 of the MOS transistor 40' is equal to or greater than about 0.3 µm. In some embodiments, the pitch D3 between the line portions 210 of the serpentine-shaped resistor 20 is equal to or greater than about 0.3 µm.

Figure 4:
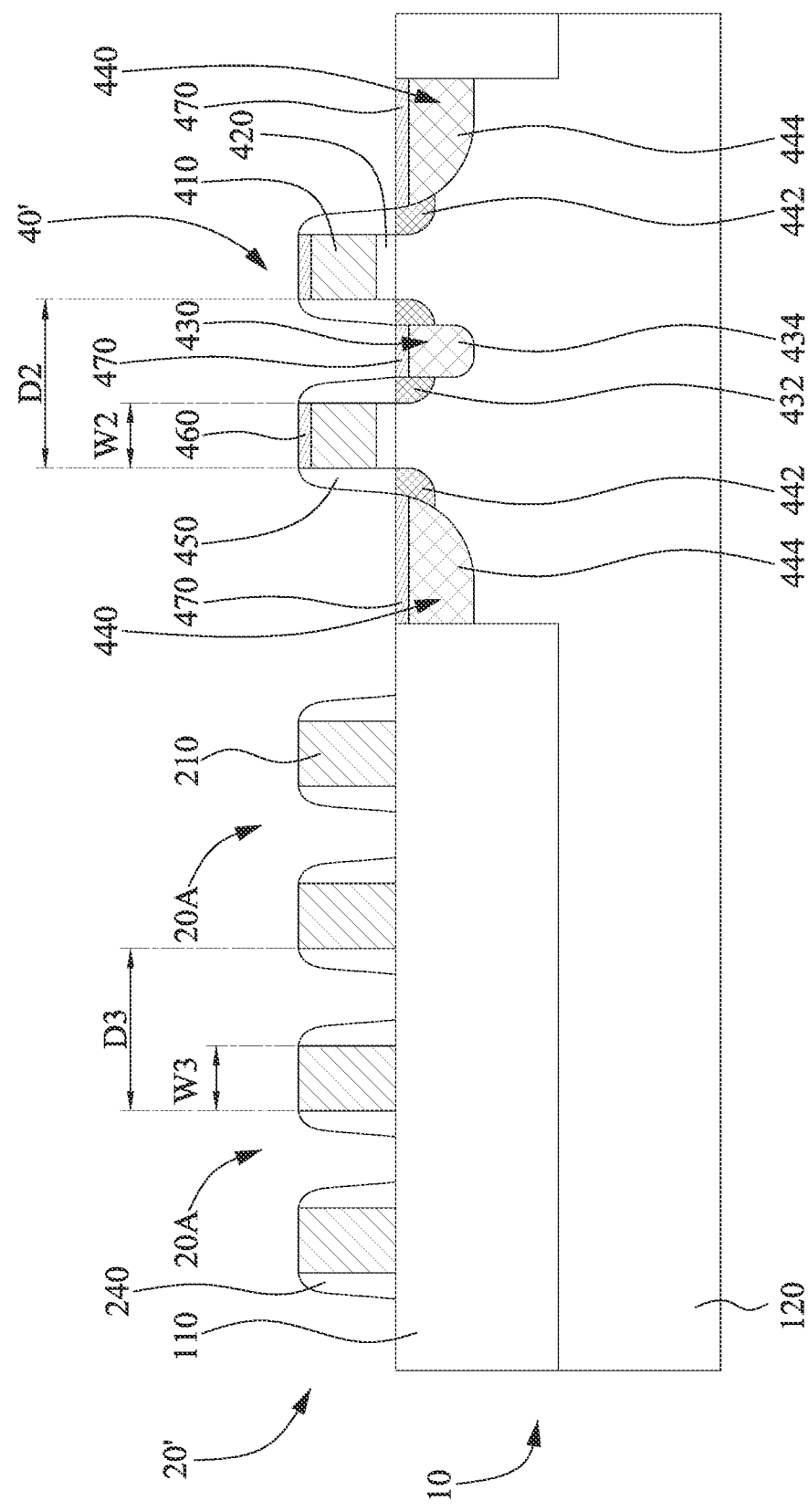
FIG. 4 is a cross-sectional view of a semiconductor structure in accordance with some embodiments of the present disclosure.

FIG. 4 is a cross-sectional view of a semiconductor structure 4 in accordance with some embodiments of the present disclosure. In some embodiments, the semiconductor structure 4 is similar to the semiconductor structure 3 in FIG. 3, with differences therebetween as follows. Descriptions of similar components are omitted.

In some embodiments, the serpentine-shaped resistor 20' further includes spacers 240. In some embodiments, the spacers 240 are on lateral sides of the line portions 210. The spacers 240 may be or include silicon dioxide, silicon oxynitride, or a combination thereof. In some embodiments, the spacers 240 of the serpentine-shaped resistor 20' and the spacers 450 of the MOS transistor 40' may be formed of or include the same material.

Figure 5:
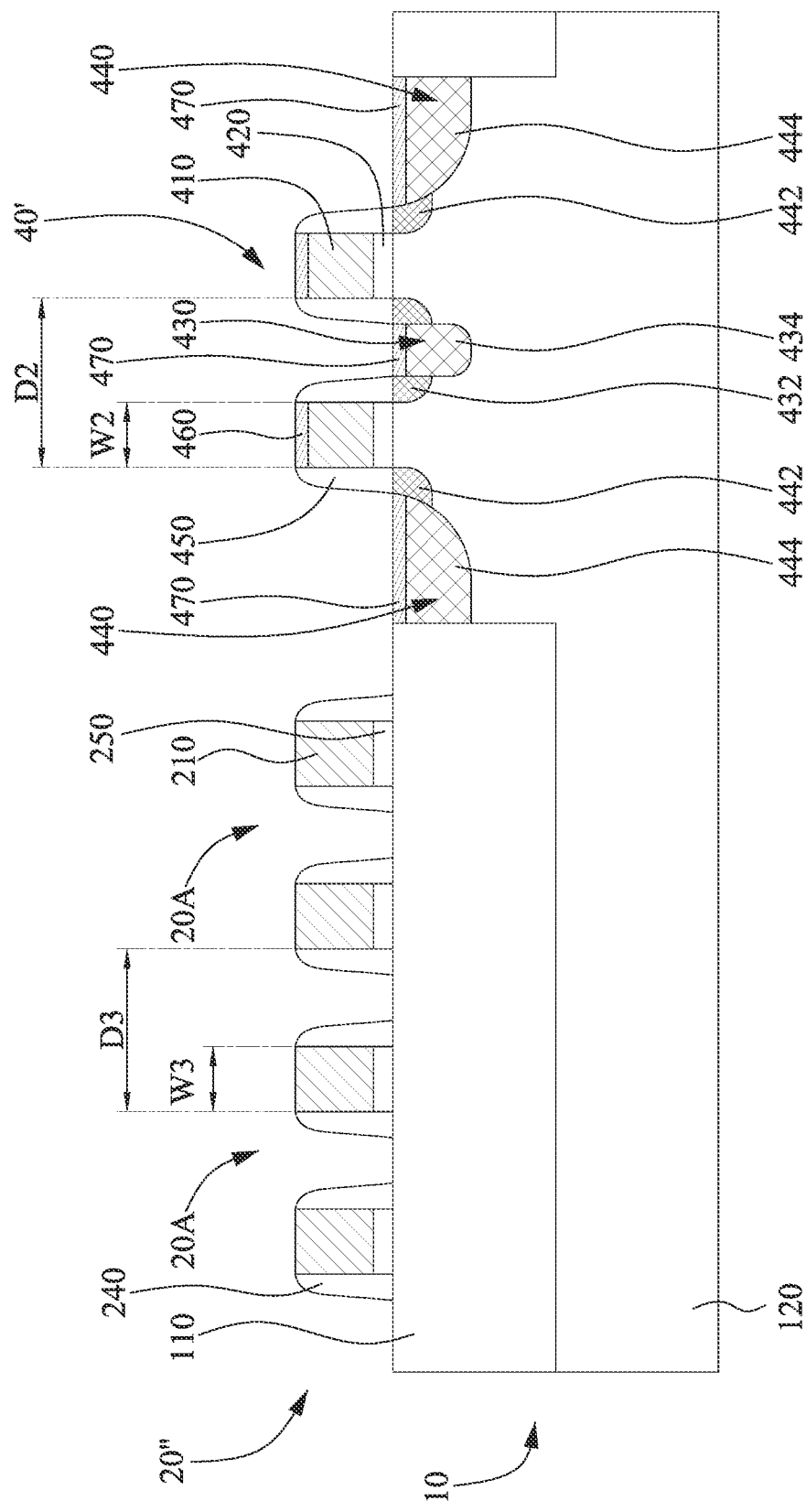
FIG. 5 is a cross-sectional view of a semiconductor structure in accordance with some embodiments of the present disclosure.

FIG. 5 is a cross-sectional view of a semiconductor structure 5 in accordance with some embodiments of the present disclosure. In some embodiments, the semiconductor structure 5 is similar to the semiconductor structure 4 in FIG. 4, with differences therebetween as follows. Descriptions of similar components are omitted.

In some embodiments, the serpentine-shaped resistor 20" further includes a plurality of dielectric layers 250. In some embodiments, the dielectric layers 250 are between the line portions 210 of the serpentine-shaped resistor 20" and the isolation structure 110 of the semiconductor substrate 10. The dielectric layer 250 may be or include a thermally grown oxide. The dielectric layer 250 may be or include silicon dioxide, silicon oxynitride, or a material having a dielectric constant greater than about 4. In some embodiments, the dielectric layers 250 of the serpentine-shaped resistor 20" and the dielectric layers 420 of the MOS transistor 40' may be formed of or include the same material.

Figure 6:
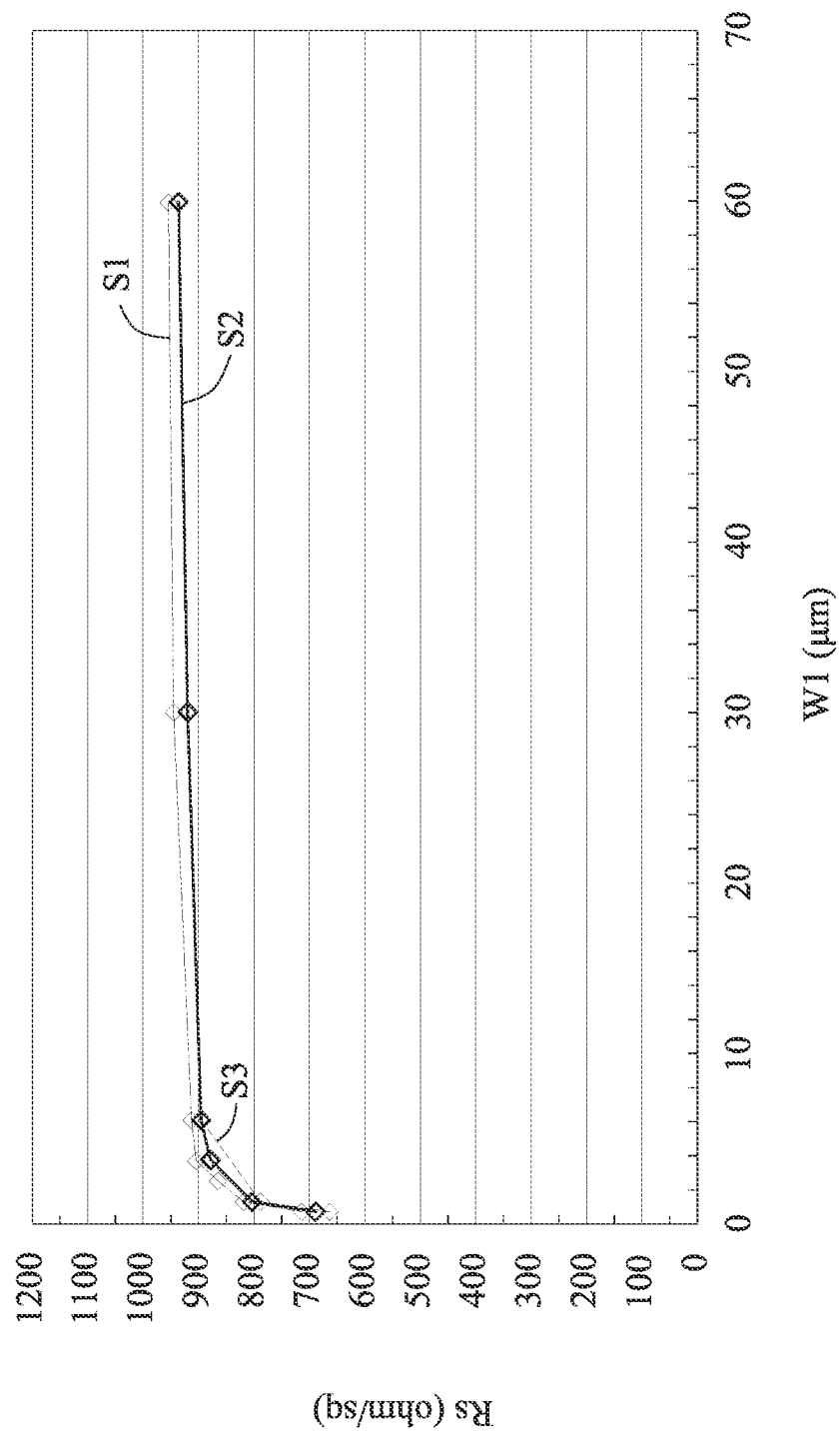
FIG. 6 shows a relationship between a sheet resistance (Rs) and a width of a serpentine-shaped resistor of a semiconductor structure in accordance with some embodiments of the present disclosure.

FIG. 6 shows a relationship between a sheet resistance (Rs) and a width (W1) of a serpentine-shaped resistor 20 of a semiconductor structure 1 in accordance with some embodiments of the present disclosure.

Referring to FIG. 6, the measurements were performed on serpentine-shaped resistors 20 including different numbers of repeating segments 20A under a forward voltage (Vf) of −2.5 V. Curve S1 indicates the relationship between a sheet resistance (Rs) and a width (W1) of a serpentine-shaped resistor 20 including two repeating segments 20A, curve S2 indicates the relationship between a sheet resistance (Rs) and a width (W1) of a serpentine-shaped resistor 20 including five repeating segments 20A, and curve S3 indicates the relationship between a sheet resistance (Rs) and a width (W1) of a serpentine-shaped resistor 20 including ten repeating segments 20A.

As shown in FIG. 6, the curves S1, S2, and S3 show that the sheet resistance (Rs) of the serpentine-shaped resistor 20 can reach a relatively high value (e.g., greater than about 800 ohm/sq) when the width W1 of the serpentine-shaped resistor 20 is equal to or greater than about 3.6 µm regardless of the number of the repeating segments 20A in a single serpentine-shaped resistor 20. On the contrary, the curves S1, S2, and S3 show that the sheet resistance (Rs) of the serpentine-shaped resistor 20 drops dramatically when the width W1 of the serpentine-shaped resistor 20 is less than about 3.6 µm regardless of the number of the repeating segments 20A in a single serpentine-shaped resistor 20.

In addition, the curves S1, S2, and S3 further show that the sheet resistance (Rs) of the serpentine-shaped resistor 20 can reach a relatively high and relatively stable value (e.g., greater than about 850 ohm/sq) when the width W1 of the serpentine-shaped resistor 20 is equal to or greater than about 4 µm regardless of the number of the repeating segments 20A. In some embodiments, a difference between the sheet resistance (Rs) of the serpentine-shaped resistors 20 having a width W1 equal to or greater than about 3.6 µm and the sheet resistance (Rs) of the serpentine-shaped resistors 20 having a width W1 equal to or greater than about 4 µm is relatively small, and thus it clearly indicates that the design of the width W1 being equal to or greater than about 3.6 µm or 4 µm can provide relatively high and stable sheet resistance (Rs) of the serpentine-shaped resistors 20. Furthermore, the design of the width W1 being equal to or greater than about 4 µm can provide an increased sheet resistance (Rs), which may contribute to an increased resistance of the serpentine-shaped resistors 20.

Moreover, the curves S1, S2, and S3 further show that the sheet resistance (Rs) of the serpentine-shaped resistor 20 can reach a further improved high and stable value (e.g., greater than about 900 ohm/sq or higher) when the width W1 of the serpentine-shaped resistor 20 is equal to or greater than about 6 µm regardless of the number of the repeating segments 20A. Furthermore, the curves S1, S2, and S3 further show that the sheet resistance (Rs) of the serpentine-shaped resistor 20 can reach a relatively high and stable value or saturation (e.g., greater than about 900 ohm/sq or higher) when the width W1 of the serpentine-shaped resistor 20 is equal to or greater than about 10 µm regardless of the number of the repeating segments 20A. According to some embodiments of the present disclosure, the width W1 of the serpentine-shaped resistor 20 may be adjusted to achieve a designed or predetermined resistance.

FIGS. 7A to 7E are cross-sectional views of intermediate stages of a method of manufacturing a semiconductor structure 3 in accordance with some embodiments of the present disclosure.

Figure 7A:
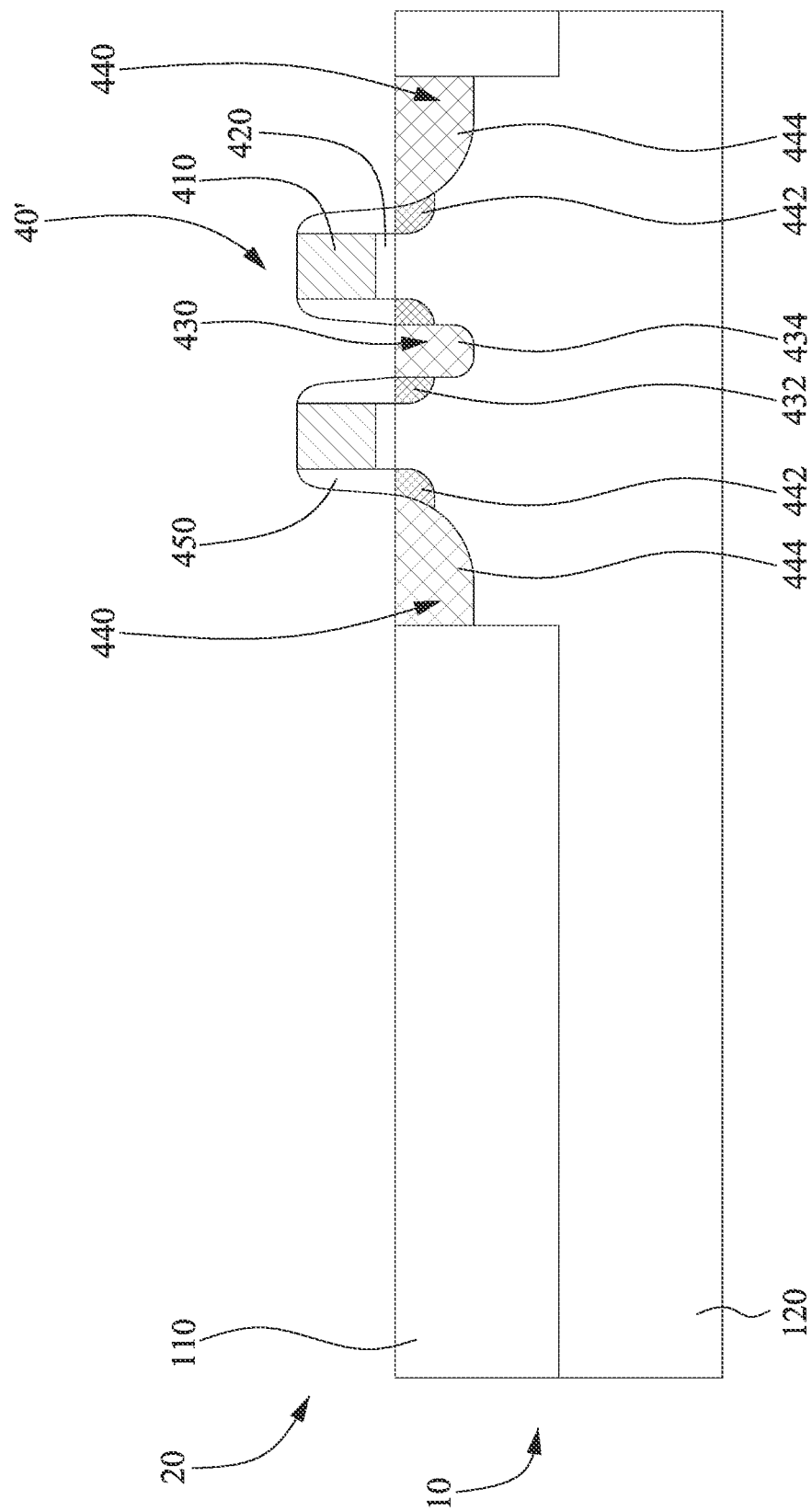
FIGS. 7A to 7E are cross-sectional views of intermediate stages of a method of manufacturing a semiconductor structure in accordance with some embodiments of the present disclosure.

Referring to FIG. 7A, a MOS transistor 40' may be formed over an active region 120 of a semiconductor substrate 10. The semiconductor substrate 10 may be provided, one or more isolation structures 110 and LDD regions 432 and 442 may be formed in the semiconductor substrate 10, a plurality of dielectric layer 420 may be formed on the active region 120, and a plurality of gate layers 410 may be formed on the dielectric layers 420. The LDD regions 432 and 442 may be formed by one or more implantation processes (not shown). The gate layers 410 and the dielectric layers 420 may be formed by depositing a dielectric material layer (e.g., a high-k dielectric material layer) on the active region 120, forming a gate material layer (e.g., a non-doped amorphous silicon or polysilicon layer) on the dielectric material layer, and patterning the gate material layer and the dielectric material layer by lithography process and/or an etching process.

Figure 7B:
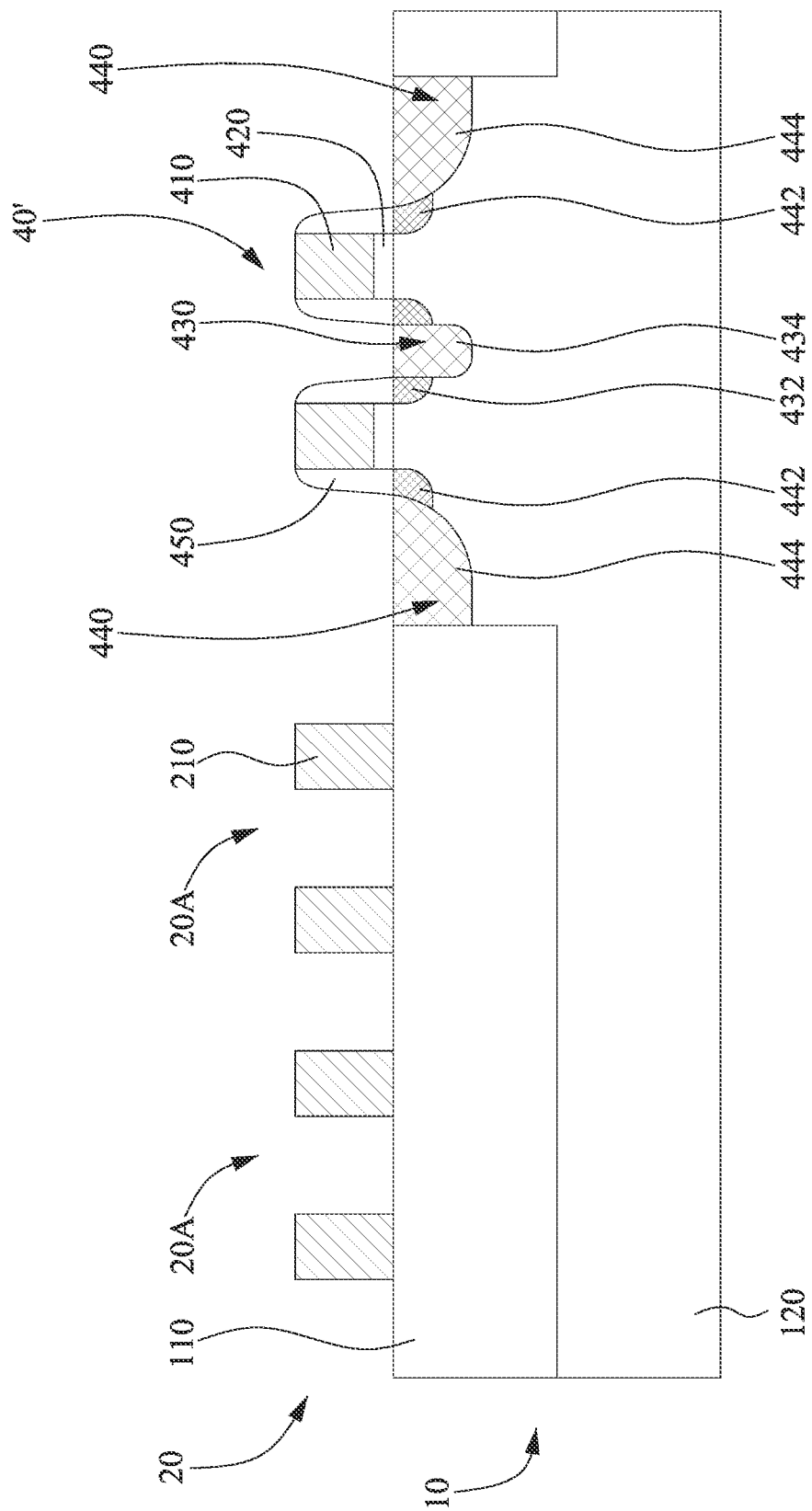

Still referring to FIG. 7B, spacers 450 may be formed on lateral surfaces of the gate layers 410, and heavily doped S/D regions 434 and 444 may be formed in the active region 120 of the semiconductor substrate 10. The spacers 450 may be formed by forming a spacer material layer covering the gate layers 410 and an upper surface of the semiconductor substrate 10, and etching the spacer material layer by anisotropic etch. The heavily doped S/D regions 434 and 444 may be performed by an ion implantation process. The LDD regions 432 and 442 and the heavily doped S/D regions 434 and 444 collectively construct S/D regions 430 and 440.

Referring to FIG. 7B, a serpentine-shaped resistor 20 including plurality of repeating segments 20A connected to each other may be formed on the isolation structure 110 of the semiconductor substrate 10. The repeating segments 20A may be or include zigzag-shaped segments as illustrated in FIG. 1A. The repeating segments 20A may include a plurality of line portions 210 and a plurality of curved portions (not shown). The serpentine-shaped resistor 20 may be formed by depositing a silicon material layer on the isolation structure 110 of the semiconductor substrate 10, and then patterning the silicon material layer. The patterning may be performed by lithography process and/or an etch process.

Figure 7C:
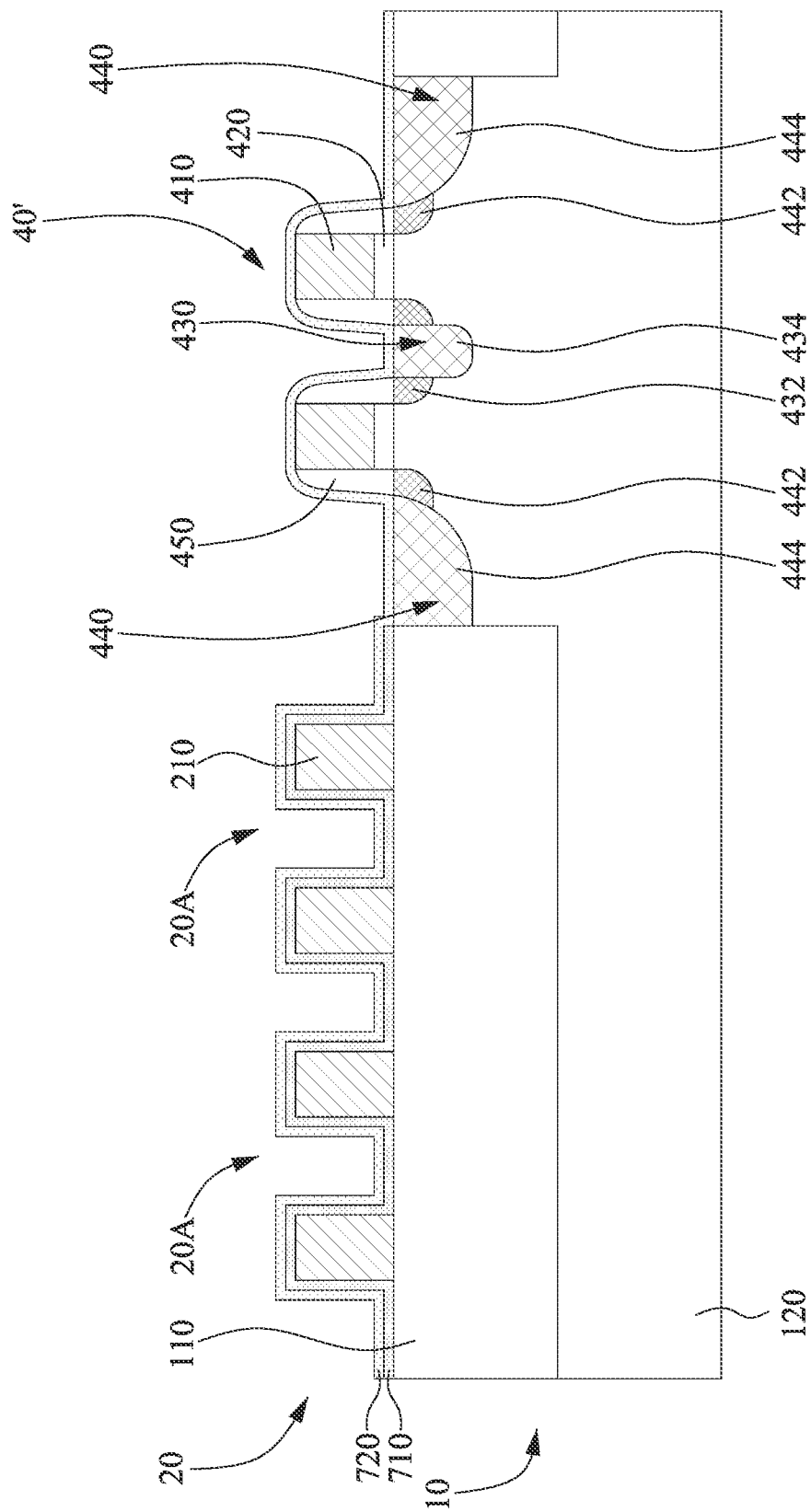

Referring to FIG. 7C, a plurality of silicide layers 460 may be formed on the gate layers 410, and a plurality of silicide layers 470 may be formed on the S/D regions 430 and 440. In some embodiments, a protective layer 710 is formed to cover the serpentine-shaped resistor 20, and a metal layer 720 is formed on the gate layers 410 the S/D regions 430 and 440, and the protective layer 710. The protective layer 710 protects the silicon layer of the serpentine-shaped resistor 20. The protective layer 710 may include a dielectric material, e.g., oxides. The metal layer 720 be or include nickel, cobalt/nickel, tungsten, platinum, zirconium, titanium, or a combination thereof. The protective layer 710 and the metal layer 720 may be formed by deposition.

Figure 7D:
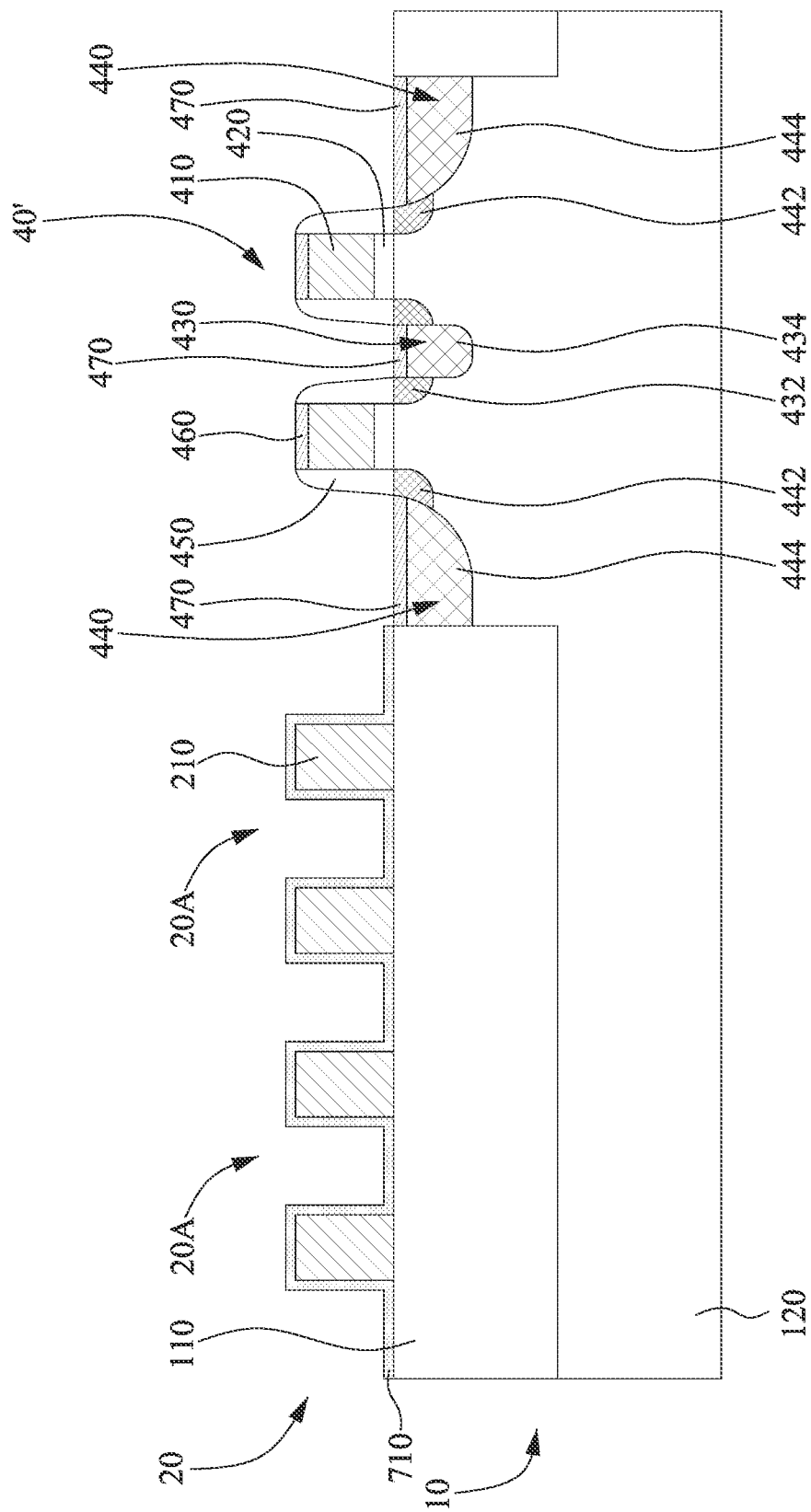

Referring to FIG. 7D, a high temperature process may be performed to alloy the metal layer 720 into the exposed silicon of the gate layers 410 and the S/D regions 430 and 440, so as to form the silicide layers 460 and 470. Excess and unalloyed metal of the metal layer 720 may be removed after the formation of the silicide layers 460 and 470.

Figure 7E:
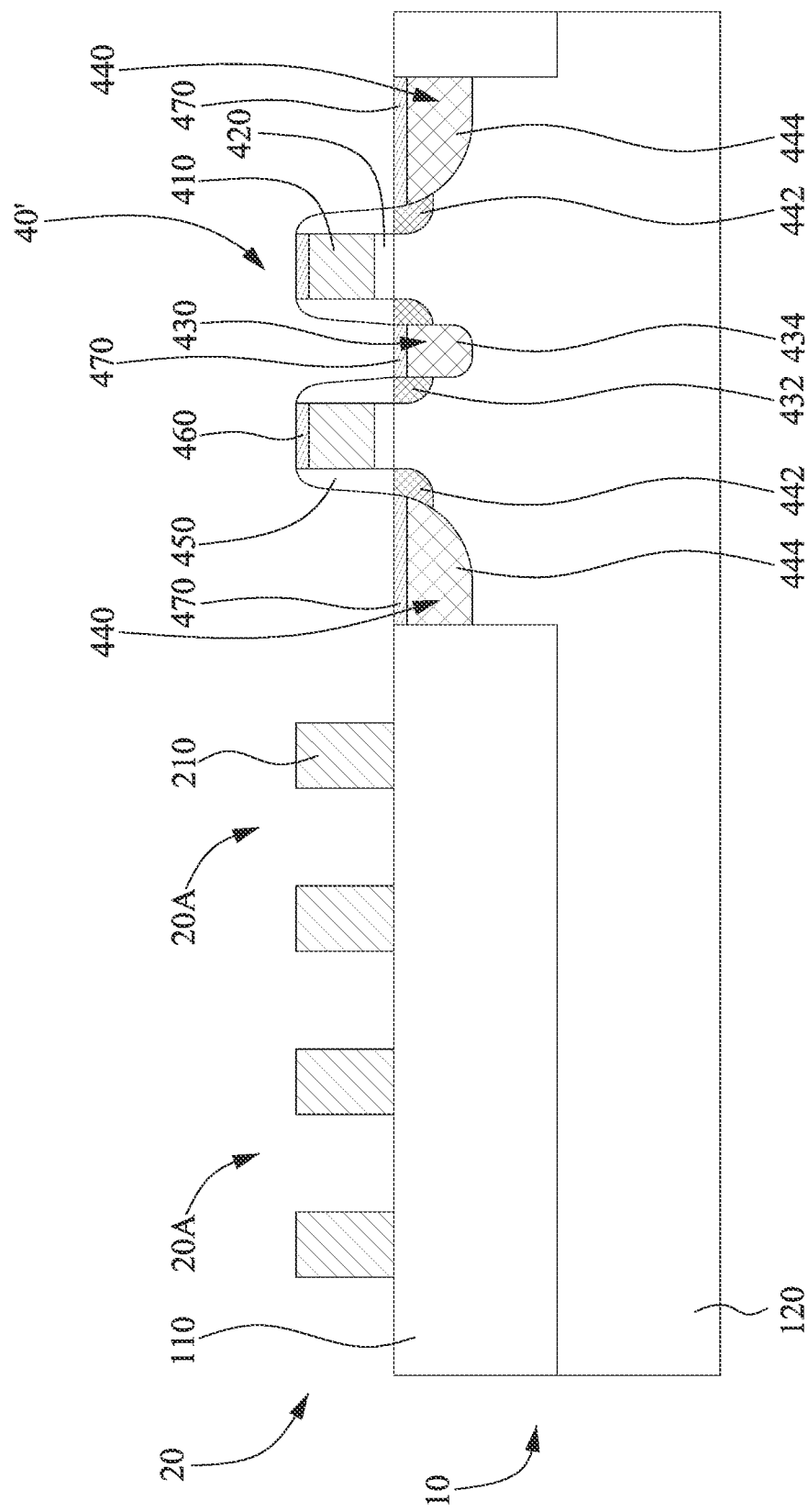

Referring to FIG. 7E, the protective layer 710 may be removed. The protective layer 710 may be removed by etching, e.g., a wet etching process. As such, the semiconductor structure 3 is formed.

FIGS. 8A to 8D are cross-sectional views of intermediate stages of a method of manufacturing a semiconductor structure 5 in accordance with some embodiments of the present disclosure.

Figure 8A:
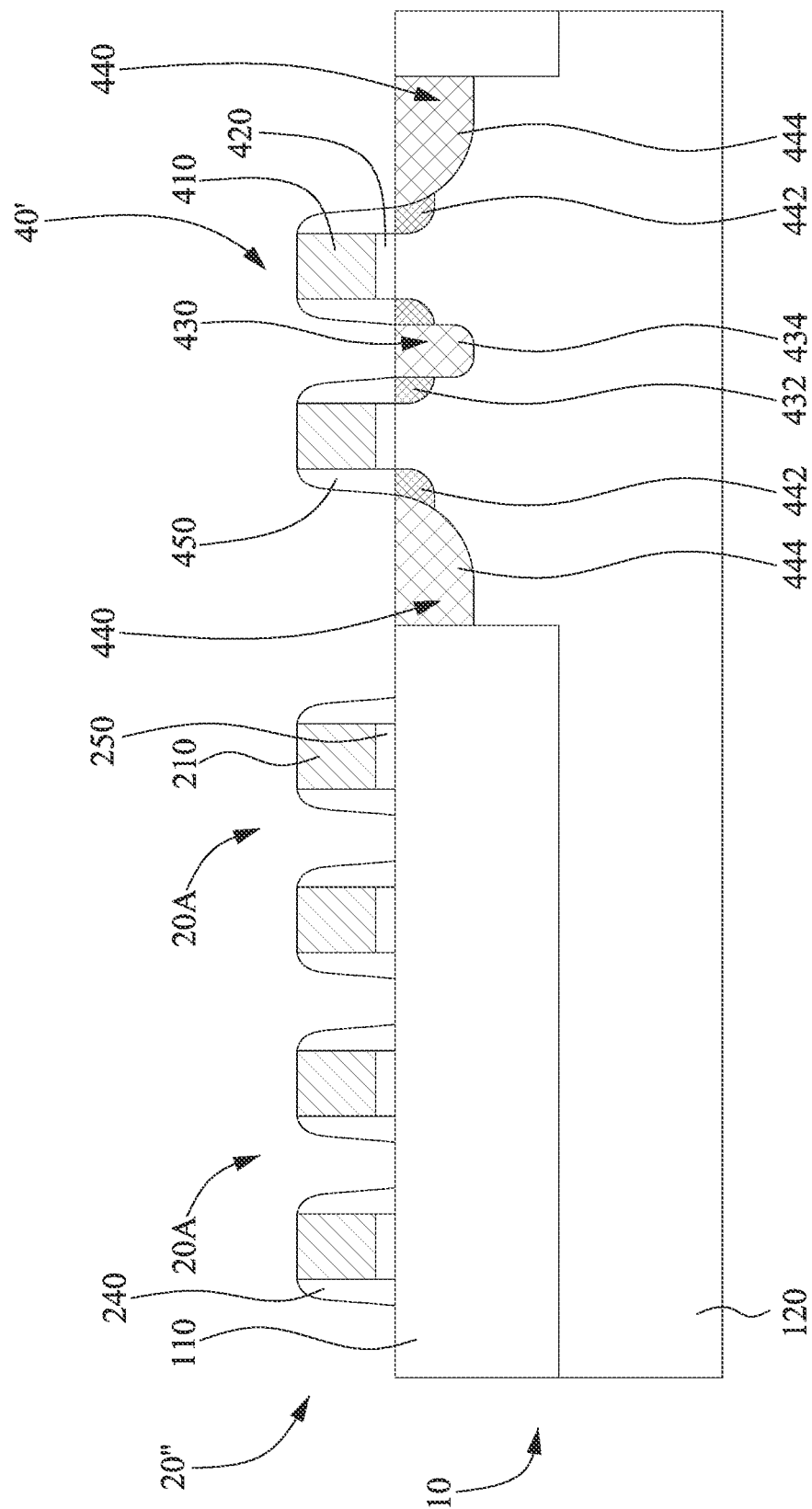
FIGS. 8A to 8D are cross-sectional views of intermediate stages of a method of manufacturing a semiconductor structure in accordance with some embodiments of the present disclosure.

Referring to FIG. 8A, a MOS transistor 40' may be formed over an active region 120 of a semiconductor substrate 10, and a serpentine-shaped resistor 20" including plurality of repeating segments 20A connected to each other may be formed on the isolation structure 110 of the semiconductor substrate 10. The repeating segments 20A may be or include zigzag-shaped segments as illustrated in FIG. 1A. The repeating segments 20A may include a plurality of line portions 210 and a plurality of curved portions (not shown).

Still referring to FIG. 8A, the semiconductor substrate 10 may be provided, and one or more isolation structures 110 and LDD regions 432 and 442 may be formed in the semiconductor substrate 10. The LDD regions 432 and 442 may be formed by one or more implantation processes (not shown).

Still referring to FIG. 8A, a plurality of dielectric layer 420 may be formed on the active region 120, a plurality of dielectric layers 250 may be formed on the isolation structure 110, a plurality of gate layers 410 may be formed on the dielectric layers 420, and a plurality of zigzag-shaped segments including line portions 210 and curved portions (not shown in FIG. 8A, which may be referred to the curved portions 220 illustrated in FIG. 1A) may be formed on the dielectric layers 250. The gate layers 410, the zigzag-shaped segments, and the dielectric layers 250 and 420 may be formed by depositing a dielectric material layer (e.g., a high-k dielectric material layer) on the isolation structure 110 and the active region 120, forming a silicon material layer (e.g., a non-doped amorphous silicon or polysilicon layer) on the dielectric material layer, and patterning the silicon material layer and the dielectric material layer by lithography process and/or an etching process. In some embodiments, the gate layers 410 and the zigzag-shaped segments of the serpentine-shaped resistor 20" are formed by the same operation (e.g., including the same deposition process and the same patterning process). In some embodiments, the gate layers 410 and the zigzag-shaped segments (including line portions and curved portions) of the serpentine-shaped resistor 20" are formed from patterning the same silicon material layer. In some embodiments, the dielectric layers 250 and 420 are formed by the same operation (e.g., including the same deposition process and the same patterning process). In some embodiments, the dielectric layers 250 and 420 are formed from patterning the same dielectric material layer.

According to some embodiments of the present disclosure, the gate layers 410 and the zigzag-shaped segments of the serpentine-shaped resistor 20" are formed by the same operation, and the dielectric layers 250 and 420 are formed by the same operation. Therefore, the manufacture of the serpentine-shaped resistor 20" which can be provided with advantages of high resistance and low area cost can be integrated with the manufacture of the MOS transistor 40', and thus the manufacturing process of the semiconductor structure can be simplified.

Still referring to FIG. 8A, a plurality of spacers 450 may be formed on lateral sides of the gate layers 410, a plurality of spacers 240 may be formed on lateral sides of the zigzag-shaped segments, and heavily doped S/D regions 434 and 444 may be formed in the active region 120 of the semiconductor substrate 10. The spacers 240 and 450 may be formed by forming a spacer material layer covering the gate layers 410, the zigzag-shaped segments (including line portions and curved portions) of the serpentine-shaped resistor 20", and an upper surface of the semiconductor substrate 10, and etching the spacer material layer by anisotropic etch. The heavily doped S/D regions 434 and 444 may be performed by an ion implantation process. The LDD regions 432 and 442 and the heavily doped S/D regions 434 and 444 collectively construct S/D regions 430 and 440.

Figure 8B:
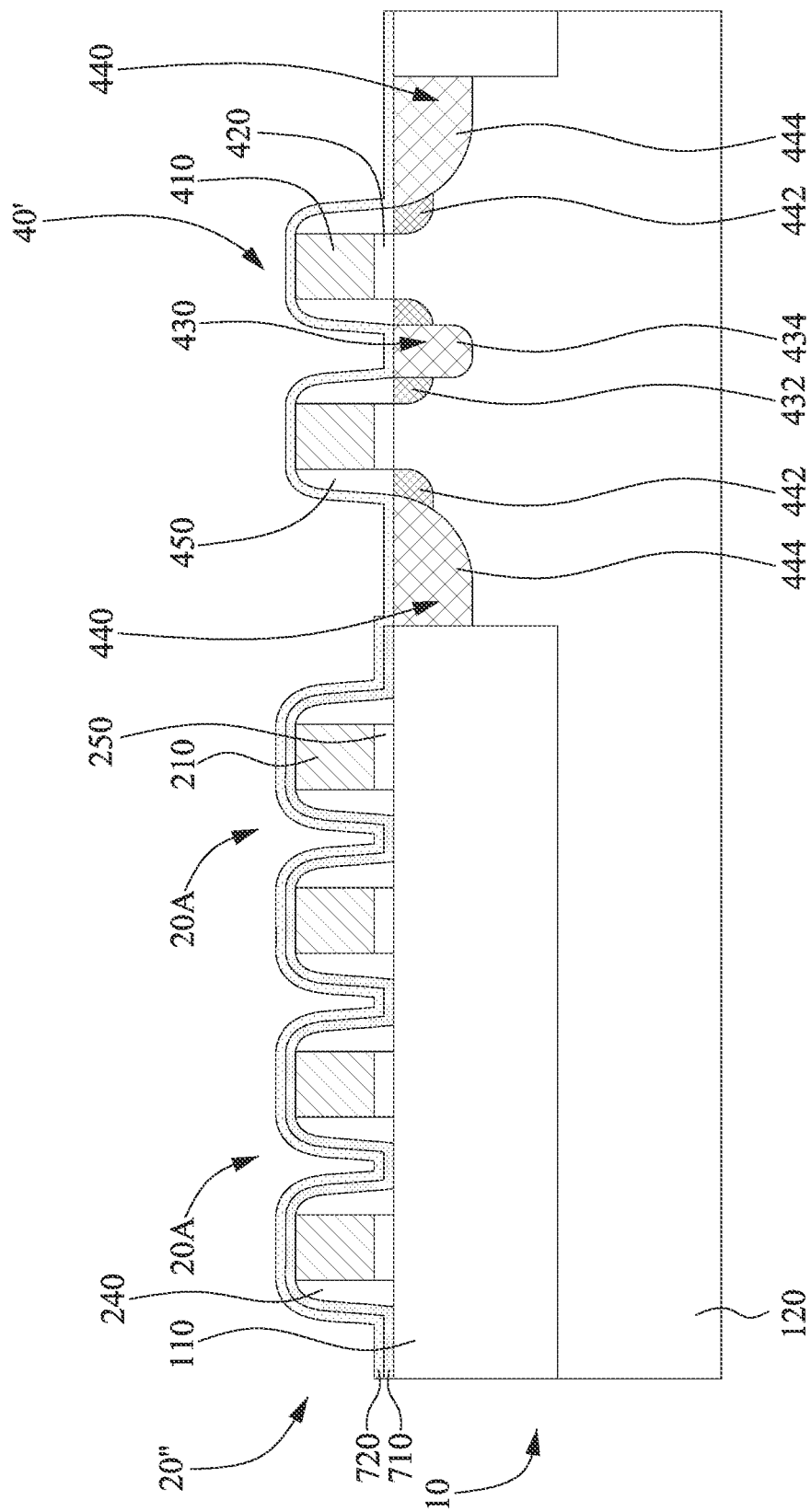

Referring to FIG. 8B, a plurality of silicide layers 460 may be formed on the gate layers 410, and a plurality of silicide layers 470 may be formed on the S/D regions 430 and 440. In some embodiments, a protective layer 710 is formed to cover the serpentine-shaped resistor 20" including the zigzag-shaped segments (including the line portions 210 and the curved portions (not shown)) and the spacers 240 of the repeating segments 20A, and a metal layer 720 is formed on the gate layers 410 the S/D regions 430 and 440, and the protective layer 710. The protective layer 710 protects the silicon layer of the zigzag-shaped segments of the serpentine-shaped resistor 20". The protective layer 710 may include a dielectric material, e.g., oxides. The metal layer 720 be or include nickel, cobalt/nickel, tungsten, platinum, zirconium, titanium, or a combination thereof. The protective layer 710 and the metal layer 720 may be formed by deposition.

Figure 8C:
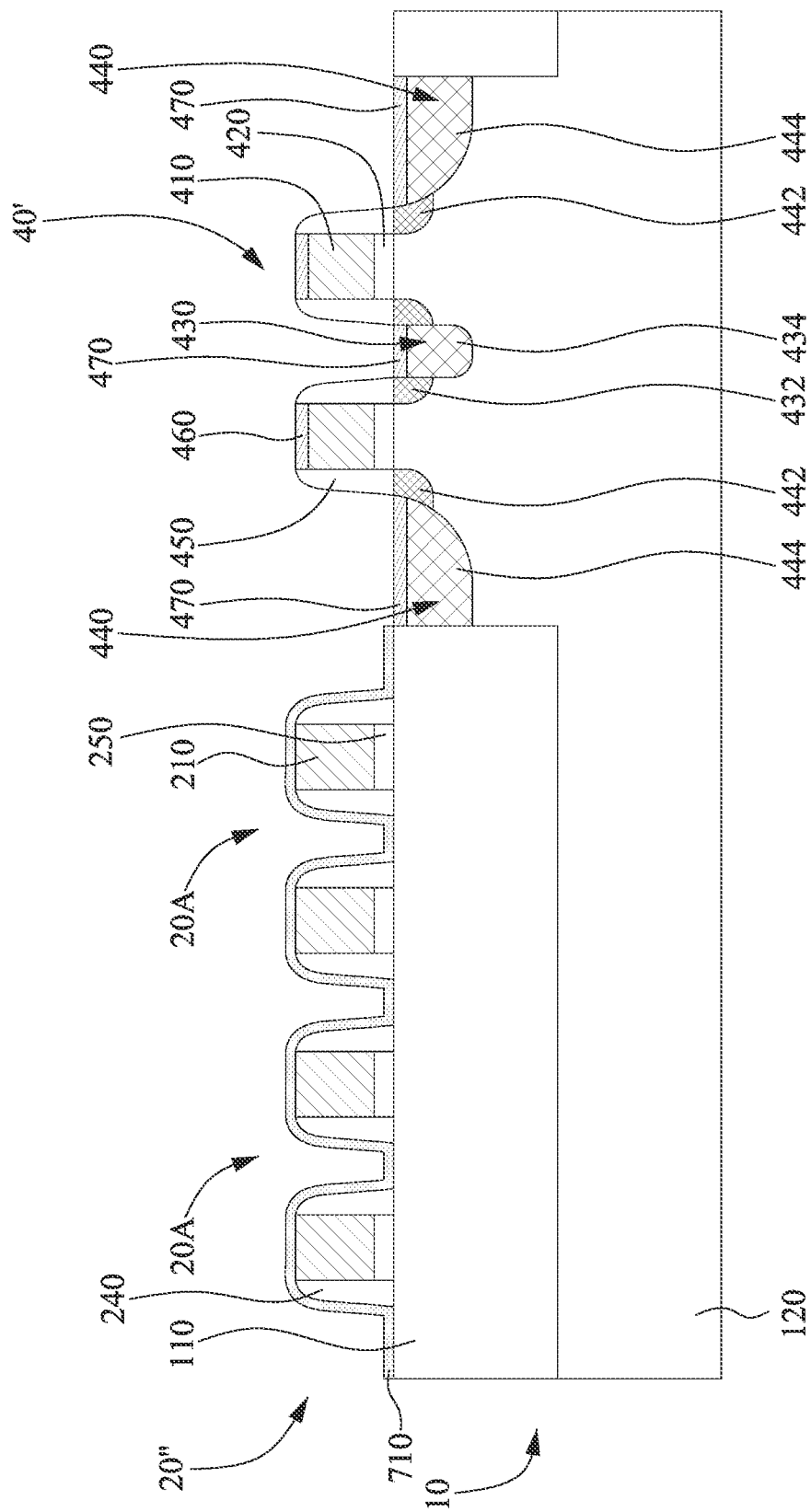

Referring to FIG. 8C, a high temperature process may be performed to alloy the metal layer 720 into the exposed silicon of the gate layers 410 and the S/D regions 430 and 440, so as to form the silicide layers 460 and 470. Excess and unalloyed metal of the metal layer 720 may be removed after the formation of the silicide layers 460 and 470.

Figure 8D:
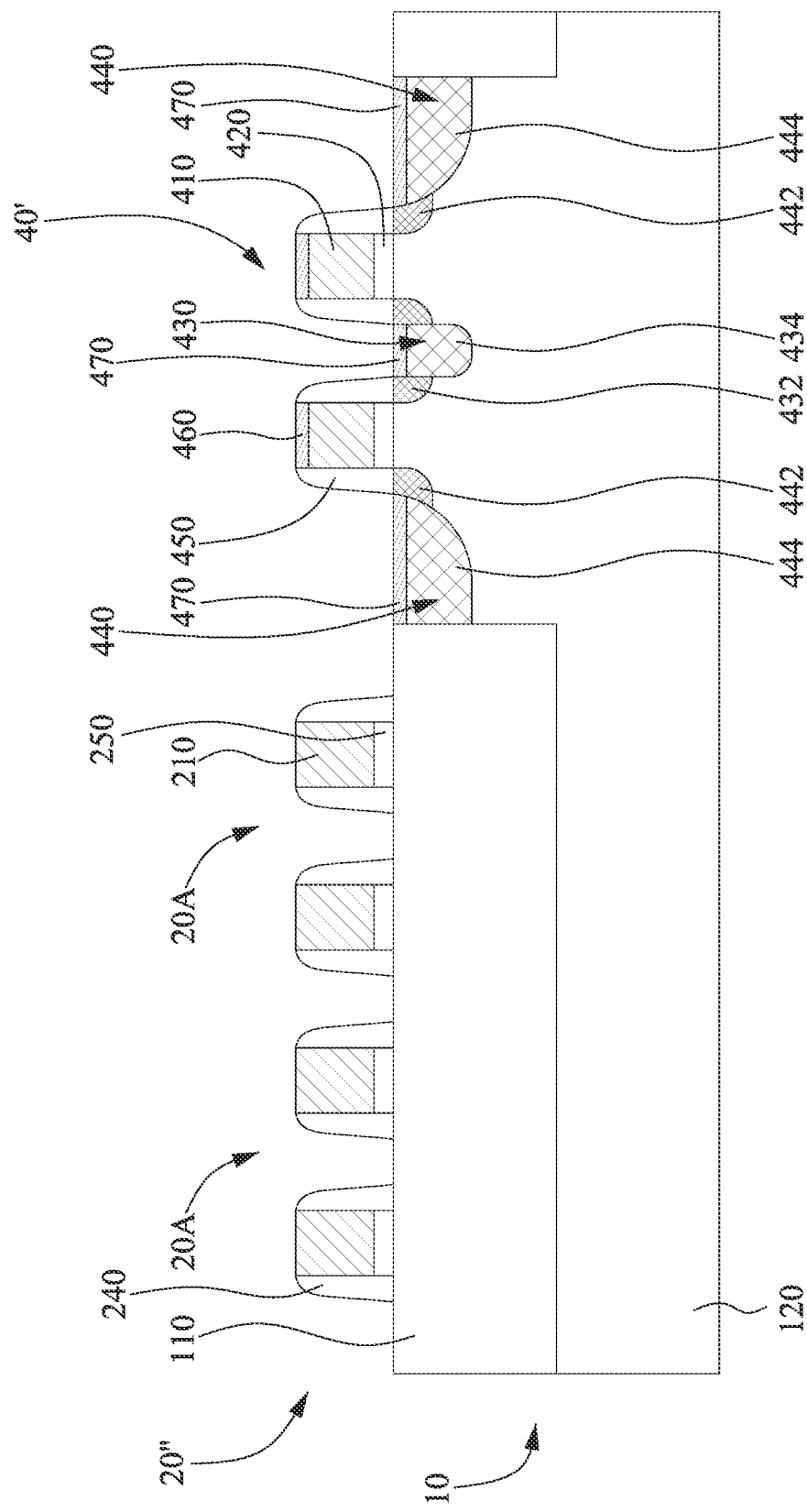

Referring to FIG. 8D, the protective layer 710 may be removed. The protective layer 710 may be removed by etching, e.g., a wet etching process. As such, the semiconductor structure 5 is formed.

According to an embodiment, a semiconductor structure includes a semiconductor substrate and a serpentine-shaped resistor. The semiconductor substrate includes an isolation structure. The serpentine-shaped resistor is over the isolation structure. The serpentine-shaped resistor includes a plurality of repeating segments connected to each other in a length direction, and a width of the serpentine-shaped resistor is equal to or greater than about 3.6 µm in a width direction.

According to an embodiment, a semiconductor structure includes a semiconductor substrate, a serpentine-shaped resistor, and a MOS transistor. The semiconductor substrate includes an isolation structure and an active region. The serpentine-shaped resistor is over the isolation structure. The serpentine-shaped resistor extends in a length direction and has a width that is equal to or greater than about 3.6 µm in a width direction. The MOS transistor is over the active region of the semiconductor substrate.

According to an embodiment, a method of manufacturing a semiconductor structure includes: forming a plurality of repeating resistor segments connected to each other in a first direction on an isolation structure of a semiconductor substrate, wherein the repeating resistor segments have a width equal to or greater than about 3.6 µm in a second direction substantially perpendicular to the first direction; and forming a MOS transistor over an active region of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate comprising an isolation structure; and
   a serpentine-shaped resistor over the isolation structure, wherein the serpentine-shaped resistor comprises a plurality of repeating segments connected to each other in a length direction and a contact portion connected to one of the repeating segments, and a width of the serpentine-shaped resistor is equal to or greater than about 3.6 µm in a width direction; and
   a resist protective oxide (RPO) layer covering the repeating segments of the serpentine-shaped resistor, wherein the contact portion is exposed by the RPO layer.

2. The semiconductor structure according to claim 1, wherein the width of the serpentine-shaped resistor is from about 3.6 µm to about 60 µm.

3. The semiconductor structure according to claim 1, wherein
   the plurality of repeating segments comprise a first repeating segment and a second repeating segment each comprising a first line portion, a second line portion, a first curved portion connecting the first line portion and the second line portion, and a second curved portion connecting to the second line portion, and
   the first curved portion of the first repeating segment is further connected to the second line portion of the second repeating segment.

4. The semiconductor structure according to claim 3, wherein the width of the serpentine-shaped resistor is defined by a maximum distance between the first curved portion and the second curved portion of the first repeating segment in the width direction.

5. The semiconductor structure according to claim 1, wherein at least one of the repeating segments comprises a line portion and a curved portion connected to the line portion, the curved portion extends in the length direction, the line portion extends in a width direction substantially perpendicular to the length direction, and a thickness of the line portion is substantially the same as a thickness of the curved portion.

6. The semiconductor structure according to claim 1, wherein the plurality of repeating segments comprise a first repeating segment, and the serpentine-shaped resistor further comprises a first terminal segment comprising the contact portion and connected to the first repeating segment, and the first terminal segment further comprises:
   a first line portion;
   a curved portion connected to the first line portion; and
   a second line portion connecting the curved portion of the first terminal segment to the first repeating segment,
   wherein the contact portion is connected to the first line portion of the first terminal segment.

7. The semiconductor structure according to claim 1, wherein the serpentine-shaped resistor comprises a silicon layer over the isolation structure, and the serpentine-shaped resistor is free of a silicide material.

8. The semiconductor structure according to claim 7, wherein the serpentine-shaped resistor further comprises a p-type doping material in the silicon layer.

9. A semiconductor structure, comprising:
   a semiconductor substrate comprising an isolation structure and an active region;
   a serpentine-shaped resistor over the isolation structure, wherein the serpentine-shaped resistor extends in a length direction and has a width that is equal to or greater than about 3.6 µm in a width direction; and
   a MOS transistor over the active region of the semiconductor substrate,
   wherein the serpentine-shaped resistor comprises a plurality of zigzag-shaped segments connected to and directly contacting each other in the length direction.

10. The semiconductor structure according to claim 9, wherein the zigzag-shaped segments comprise a first zigzag-shaped segment, a second zigzag-shaped segment, and third zigzag-shaped segment arranged in a row in the length direction, and the third zigzag-shaped segment is between and contacting the first zigzag-shaped segment and the second zigzag-shaped segment.

11. The semiconductor structure according to claim 9, further comprising a resist protective oxide (RPO) layer over the isolation structure and covering the serpentine-shaped resistor.

12. The semiconductor structure according to claim 9, wherein the MOS transistor comprises a gate layer and a silicide layer on the gate layer, and the serpentine-shaped resistor is free of a silicide material.

13. The semiconductor structure according to claim 12, wherein the serpentine-shaped resistor comprises a silicon layer and a p-type doping material in the silicon layer, and the gate layer of the MOS transistor is free of a p-type doping material.

14. The semiconductor structure according to claim 9, wherein the MOS transistor comprises a plurality of gate layers, the serpentine-shaped resistor comprises a plurality of line portions connected to each other through a plurality of curved portions, and a pitch between the gate layers of the MOS transistor is substantially the same as a pitch between the line portions of the serpentine-shaped resistor.

15. The semiconductor structure according to claim 14, wherein a line width of the gate layers of the MOS transistor is substantially the same as a line width of the line portions of the serpentine-shaped resistor.

16. The semiconductor structure according to claim 14, further comprising a plurality of dielectric layers between the gate layers of the MOS transistor and the active region of the semiconductor substrate and between the line portions of the serpentine-shaped resistor and the isolation structure of the semiconductor substrate.

17. A semiconductor structure, comprising:
a semiconductor substrate comprising an isolation structure and an active region;
a serpentine-shaped resistor over the isolation structure, wherein the serpentine-shaped resistor extends in a first direction and has a width that is equal to or greater than about 3.6 μm in a second direction that is substantially perpendicular to the first direction; and
a MOS transistor comprising a plurality of gate layers over the active region of the semiconductor substrate, wherein an elevation of a top surface of at least one of the gate layers is between an elevation of a top surface of the isolation structure and an elevation of a top surface of the serpentine-shaped resistor.

18. The semiconductor structure according to claim 17, wherein the serpentine-shaped resistor comprises a plurality of line portions extending in the second direction and a plurality of spacers on lateral sides of the line portions, the MOS transistor comprises a plurality of spacers on lateral sides of the gate layers, and the spacers of the serpentine-shaped resistor and the spacers of the MOS transistor are formed of a same material.

19. The semiconductor structure according to claim 17, wherein the serpentine-shaped resistor comprises a plurality of line portions extending in the second direction and a plurality of dielectric layers between the line portions and the isolation structure, the MOS transistor comprises a plurality of gate dielectric layers between the gate layers and the active region, and the dielectric layers of the serpentine-shaped resistor and the gate dielectric layers of the MOS transistor are formed of a same material.

20. The semiconductor structure according to claim 17, wherein the serpentine-shaped resistor comprises a first line portion, a second line portion, and a curved portion connecting the first line portion and the second line portion, the first line portion and the second line portion are tilted away from a virtual line extending in the second direction and passing the curved portion by an angle of greater than 0° and less than about 10°, and the first line portion and the second line portion are tilted toward different directions.

\* \* \* \* \*